United States Patent [19]
Kikuno

[11] Patent Number: 5,126,758
[45] Date of Patent: Jun. 30, 1992

[54] OPTICAL PRINTER

[75] Inventor: Mitsutoyo Kikuno, Tokyo, Japan

[73] Assignee: Ricoh Company, Ltd., Tokyo, Japan

[21] Appl. No.: 547,144

[22] Filed: Jul. 3, 1990

[30] Foreign Application Priority Data

Jul. 4, 1989 [JP] Japan .................. 1-172515
Feb. 23, 1990 [JP] Japan .................. 2-43857

[51] Int. Cl.$^5$ .......................... G11C 19/00
[52] U.S. Cl. .................... 346/107 R; 377/54; 377/67
[58] Field of Search ......... 346/107 R, 76 PH, 160, 346/154; 377/64, 70, 73, 75, 34, 53, 54, 67, 112

[56] References Cited

U.S. PATENT DOCUMENTS 4,413,269 11/1983 Pawletko et al. .................. 346/154
4,731,673 3/1988 Yamakawa .................. 346/160
4,937,591 6/1990 Miyake et al. .................. 346/107 R
4,983,989 1/1991 Komuro et al. .................. 346/76 PH X Primary Examiner—Mark J. Reinhart
Attorney, Agent, or Firm—Oblon, Spivak, McClelland, Maier & Neustadt

[57] ABSTRACT

An optical printer with a print head having numerous light emitting elements for reproducing medium densities of a multi-tone document image faithfully. When image data are inputted to individual serial shift registers, the entry of next image data is inhibited and, in response to a clock signal having a predetermined frequency, light emitting elements associated one-to-one with the shift registers are each turned on for a particular period of time associated with a logical value of an internal state stored in the associated shift register. The frequency of the clock signal is variable to adjust the turn-on time of the light emitting elements as desired.

8 Claims, 6 Drawing Sheets

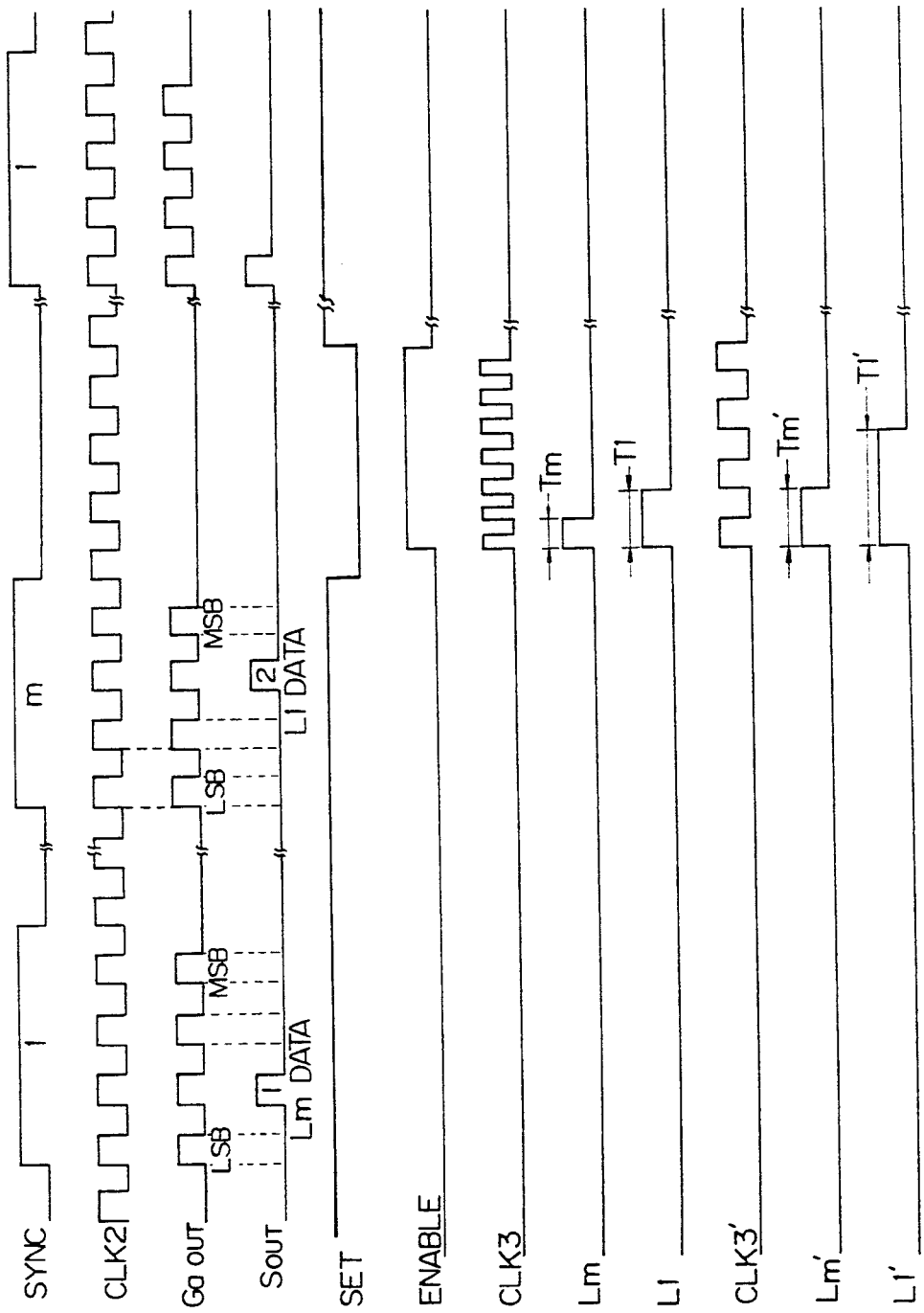

OPTICAL PRINTER

BACKGROUND OF THE INVENTION

The present invention relates to an optical printer having a print head made up of a number of light emitting elements and capable of reproducing medium densities which represent the tones of a document faithfully. More particularly, the present invention is concerned with an optical printer operable at high speed with simple circuitry and control.

A recent achievement in the imaging art is an optical printer having a print head which is implemented as an array of numerous light emitting elements such as minute light emitting diodes (LEDs). The LEDs are selectively turned on or off in response to a two-level digital image signal which is representative of the density of a document image, thereby exposing the surface of a photoconductive element. A latent image electrostatically formed on the photoconductive element by the exposure is turned to a visible image by development. The visible image is transferred into a paper sheet and then fixed on the paper sheet. This type of printer has only a small number of mechanically movable parts and, therefore, can print out images at high speed and with a minimum of noise. For this reason, many modern facsimile machines, computer terminals and other similar equipment use an optical printer. Of course, this type of printer has to reproduce medium densities faithfully. To meet this requirement, it has been customary to use a dither method. The dither method uses a dither matrix for dividing a document image into pixels, as is well known in the art. The density of each pixel is compared with associated one of predetermined threshold values of the dither matrix and is thereby determined to be white or black. The aggregation of the resulting small dots renders medium tones of an image. The number of black dots is varied on the basis of the densities of the individual pixels, whereby the densities of a multi-tone image is rendered. The problem with the dither method is that when the number of such small dots is small, the resolution is lowered to prevent a reproduced image from bearing clear medium tones.

In the light of the above, it has been proposed to render the densities of individual pixels by the $2^n$-tone intensity modulation of individual light emitting elements for an n-bit digital image signal. For example, Japanese Patent Laid-Open Publication No. 127467/1984 discloses a multi-tone printer driving device adopting a so-called dynamic light emitting element turn-on control for the intensity modulation. Specifically, resistors are connected in series with light emitting elements, and their values are switched over to control the drive currents to be applied to the associated light emitting elements. As a result, the intensity of light issuing from each light emitting element and, therefore, the intensity of exposure of a photoconductive element is controlled. On the other hand, Japanese Patent Laid-Open Publication No. 64870/1985 implements the dynamic light emitting element turn-on control by controlling the turn-on time of light emitting elements in matching relation to the image density. Specifically, this prior art uses LED drivers associated one-to-one with light emitting diodes, a gate circuit for controlling the turn-on time of each light emitting element, a data selector for selecting light emitting elements to be turned on, a turn-on time control signal generating circuit for generating a signal for controlling the gate circuit to change the turn-on time, and a gate circuit for ANDing the turn-on time control signal and a turn-on element selection signal. In such a configuration, the densities of a document image are determined with respect to a plurality of steps, and the turn-on time of the light emitting elements is variably controlled on the basis of the result of decision.

However, a drawback with the prior art schemes described above is that they need complicated circuitry and, therefore, fail to cut down the cost of the apparatus. Specifically, previously mentioned Laid-Open Publication No. 127467/1984 needs the same number of light emitting element drivers as the tones to be rendered. This, coupled with the fact that it has some problems concerning high-speed operations, makes the circuit arrangement extremely complicated. The other Laid-Open Publication No. 64870/1985 mentioned specifically cannot implement a high-speed printer unless all the light emitting elements are provided with exclusive turn-on time control signal generating circuits, whereby the circuitry becomes more complicated as the number of light emitting elements of light emitting element blocks increases.

SUMMARY OF THE INVENTION

It is therefore an object of the present invention to provide an optical printer capable of reproducing medium densities of a multi-tone image faithfully.

It is another object of the present invention to provide an optical printer having a high-speed printing capability despite simple circuitry and control thereof.

It is another object of the present invention to provide an inexpensive optical printer.

It is another object of the present invention to provide a generally improved optical printer.

An optical printer using a print head having a plurality of light emitting elements for reproducing $2^n$ tones for n-bit digital image data representative of one pixel of the present invention comprises a decoder for converting the n-bit image data into $2^n$-bit image data, $2^n$-bit serial shift registers each being associated with respective ones of the light emitting elements and receiving $2^n$-bit image data outputted by the decoder, and a controller for controlling input of the $2^n$-bit image data to the serial shift registers such that when image data are inputted to the individual serial shift registers, input of the next image data is inhibited and, by a clock signal have a predetermined frequency, the light emitting elements each is turned on for a period of time associated with a logical value of an internal state stored in associated ones of the serial shift registers.

BRIEF DESCRIPTION OF THE DRAWINGS

The above and other objects, features and advantages of the present invention will become more apparent from the following detailed description taken with the accompanying drawings in which:

FIGS. 6A to 6L are timing charts representative of the operation of the embodiment shown in FIG. 5.

DESCRIPTION OF THE PREFERRED EMBODIMENTS

Figure 1:
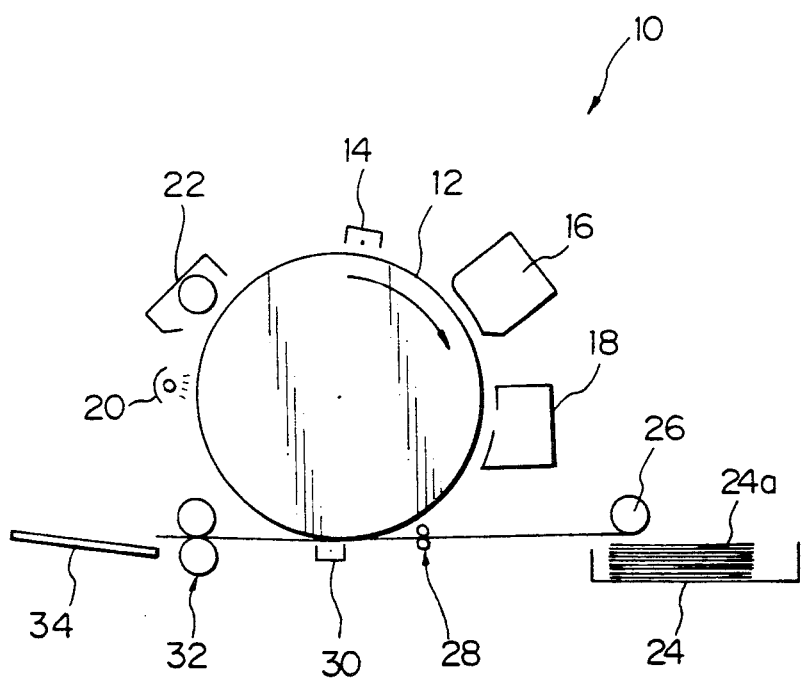
FIG. 1 is a section showing a conventional optical printer.

To better understand the present invention, a brief reference will be made to a conventional optical printer, shown in FIG. 1. As shown, the optical printer, generally 10, has a photoconductive drum 12 which is covered with a photoconductive material. Arranged around the drum 12 are a charger 14, an optical print head 16, a developing unit 18, an eraser 20, and a cleaner 22. The charger 14 uniformly charges the surface of the drum 12, while the print head 16 exposes the charged surface of the drum 12 on the basis of image information and thereby electrostatically forms a latent image thereon. The developing unit 18 develops the latent image to produce a visible image. The eraser 20 dissipates the charge remaining on the drum 12 after the transfer of the visible image to a paper sheet. The cleaner 22 removes the developer which remains on the surface of the drum 12 after the image transfer. A paper transport path extends via an image transfer station which is defined at one side of the drum 12. Arranged along the paper transport path are a paper cassette 24 loaded with a stack of paper sheets 24a, a feed roller 26 for feeding the paper sheets 24a one at a time, a register roller pair 28 for driving the paper sheet 24a fed by the feed roller 26 toward the image transfer station at a predetermined timing, a transfer unit 30 for transferring the visible image to the paper sheet 24a at the image transfer station, a fixing unit 32 for fixing the image transferred to the paper sheet 24a, and a tray 34 for receiving the paper sheet 24a driven out from the paper transport path.

In operation, the drum 12 is rotated in a direction indicated by an arrow in the figure. As a document reader, not shown, feeds its output signal to the print head 16, LEDs built in the head 16 are selectively turned on to electrostatically form a latent image on the charged surface of the drum 12. The developing unit 18 deposits a toner on the latent image, and the resulting toner image is transferred to the paper sheet 24a by the transfer unit 30. The fixing unit 32 fixes the toner image on the paper sheet 24a by applying heat thereto. The paper sheet 24a with the fixed toner image is driven out to the tray 34. The eraser 20 dissipates the charge remaining on the drum 12, and then the cleaner 22 removes the toner also remaining on the drum 12. The charger 14 again uniformly charges the cleaned surface of the drum 12 to prepare it for another image forming operation.

The conventional printer having the above construction has some problems left unsolved concerning faithful reproduction of medium densities of a multi-tone document image, as discussed earlier.

Figure 2:
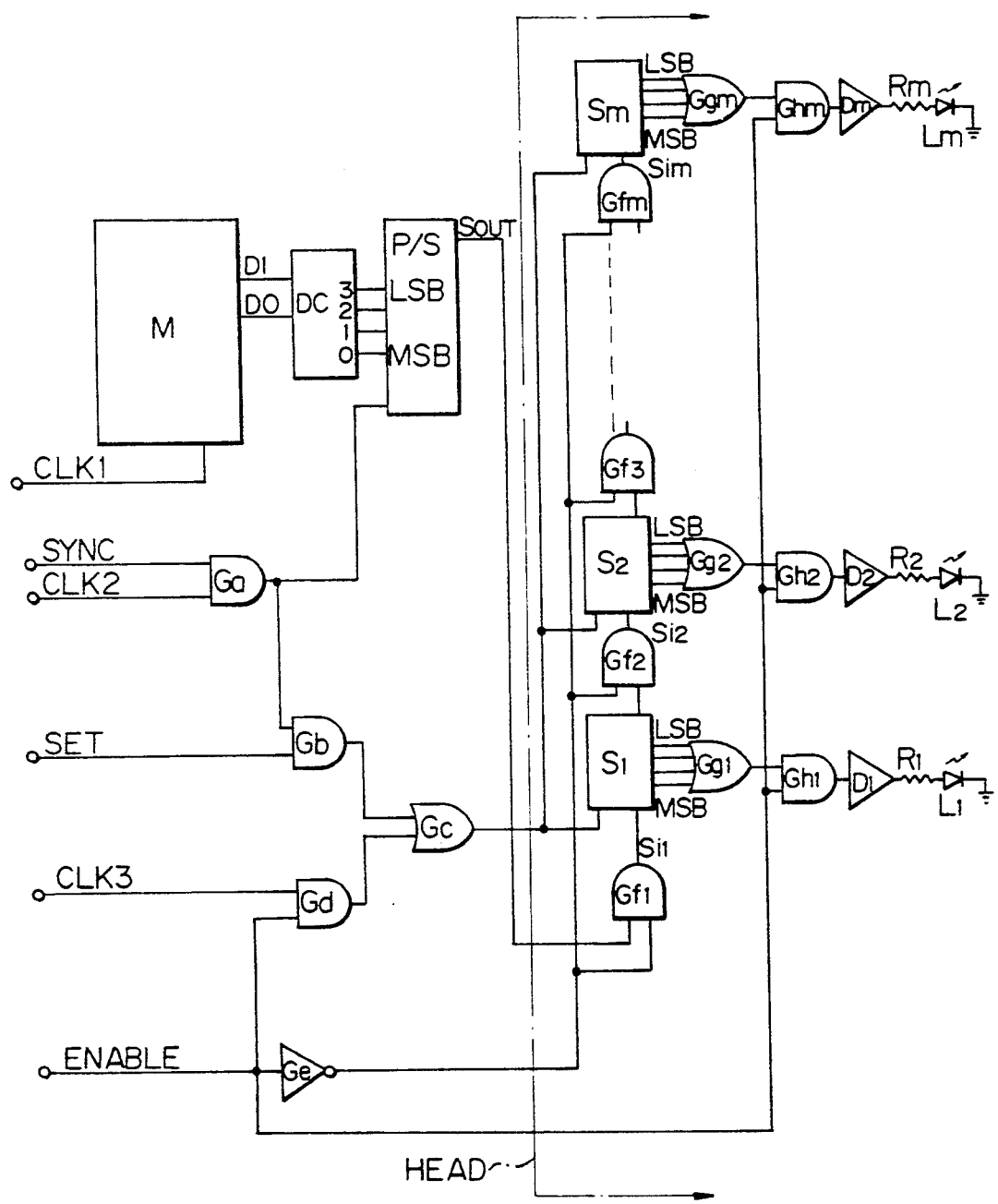
FIG. 2 is a block diagram schematically showing a head drive control circuit representative of an embodiment of the optical printer in accordance with the present invention.

Referring to FIG. 2, a preferred embodiment of the optical printer in accordance with the present invention will be described. Specifically, FIG. 2 shows a circuit for controllably driving a print head and is representative of the illustrative embodiment. An image memory M stores image data in which one pixel is represented by two bits. The two bits of data $D_1$ and $D_0$ are read out of the image memory M in synchronism with a first clock CLK1 and are fed to a 2-to-4 (2/4) line decoder DC. The 4-line parallel output of the 2/4 line decoder DC is applied to a parallel-to-serial converter P/S. The output Sout of the converter P/S is fed to a print head HEAD (indicated by a dash-and-dot line in the figure) which has LEDs, as will be described in detail later. A second clock CLK2 and a synchronizing signal SYNC are fed to an AND gate Ga. ANDing the two inputs CLK2 and SYNC, the AND gate Ga delivers the resulting clock to the coverter P/S as a clock for transferring the serial image data from the converter P/S to the print head HEAD. The output of the AND gate Ga is applied to a second AND gate Gb also. In response to the output of the AND gate Ga and a SET signal, the AND gate Gb produces an output for controlling setting of head line data. Specifically, the output of the AND gate Gb is fed to one input of an OR gate Gc. In this configuration, until the set signal appears, the clock CLK2 is inhibited from reaching the print head HEAD. A third AND gate Gd serves to control the turn-on time of LEDs, i.e., it ANDs a third clock CLK3 and an enable signal ENABLE and delivers the result to the OR gate Gc. Hence, only when the enable sinal ENABLE is in a high level or "H", the third clock CLK3 is fed to the print head HEAD. Adapted to control the second and third clocks CLK2 and CLK3, the OR gate Gc outputs the second clock CLK2 in the event of data transfer and the third clock CLK3 in the event of the turn-on of LEDs, on the basis of the timings at which the signals SET and ENABLE appear. An inverter gate Ge inverts the logic of the signal ENABLE and feeds its output to AND gates which are incorporated in the head HEAD for controlling shift registers, as will be described.

As also shown in FIG. 2, the print head HEAD has 4-bit shift registers $S_1$ to $S_m$ and LEDs $L_1$ to $L_m$ each being associated with respective ones of the shift registers $S_1$ to $S_m$. Each of the shift registers $S_1$ to $S_m$ receives the output or clock of the OR gate Gc and the output Sout of the 4-bit parallel-to-serial converter P/S. Specifically, the output Sout of the converter P/S is routed to the data input terminals of the individual shift registers $S_1$ to $S_m$ through AND gates $G_{f1}$ to $G_{fm}$ associated one-to-one with the shift registers $S_1$ to $S_m$. The AND gates $G_{f1}$ to $G_{fm}$ each receives at the other input thereof the output of the immediately preceding shift register. The 4-bit outputs of the shift registers $S_1$ to $S_m$ are fed respectively to AND gates $G_{h1}$ to $G_{hm}$ via associated 4-input OR gates $G_{g1}$ to $G_{gm}$. The outputs of the AND gates $G_{h1}$ to $G_{hm}$ are in turn routed through LED drivers $D_1$ to $D_m$ and resistors $R_1$ to $R_m$ to the LEDs $L_1$ to $L_m$, respectively. The enable signal ENABLE is applied to the other input of the individual AND gates $G_{h1}$ to $G_{hm}$, so that the LED drivers $D_1$ to $D_m$ turn on their associated LEDs $L_1$ to $L_m$ when the signal ENABLE is "H".

The operation of the head drive control circuit having the above construction will now be described with reference to FIGS. 3 and 4A to 4I. In FIGS. 4A to 4I, the same signals as those shown in FIGS. 2 and 3 are designated by identical labels.

Figure 4:
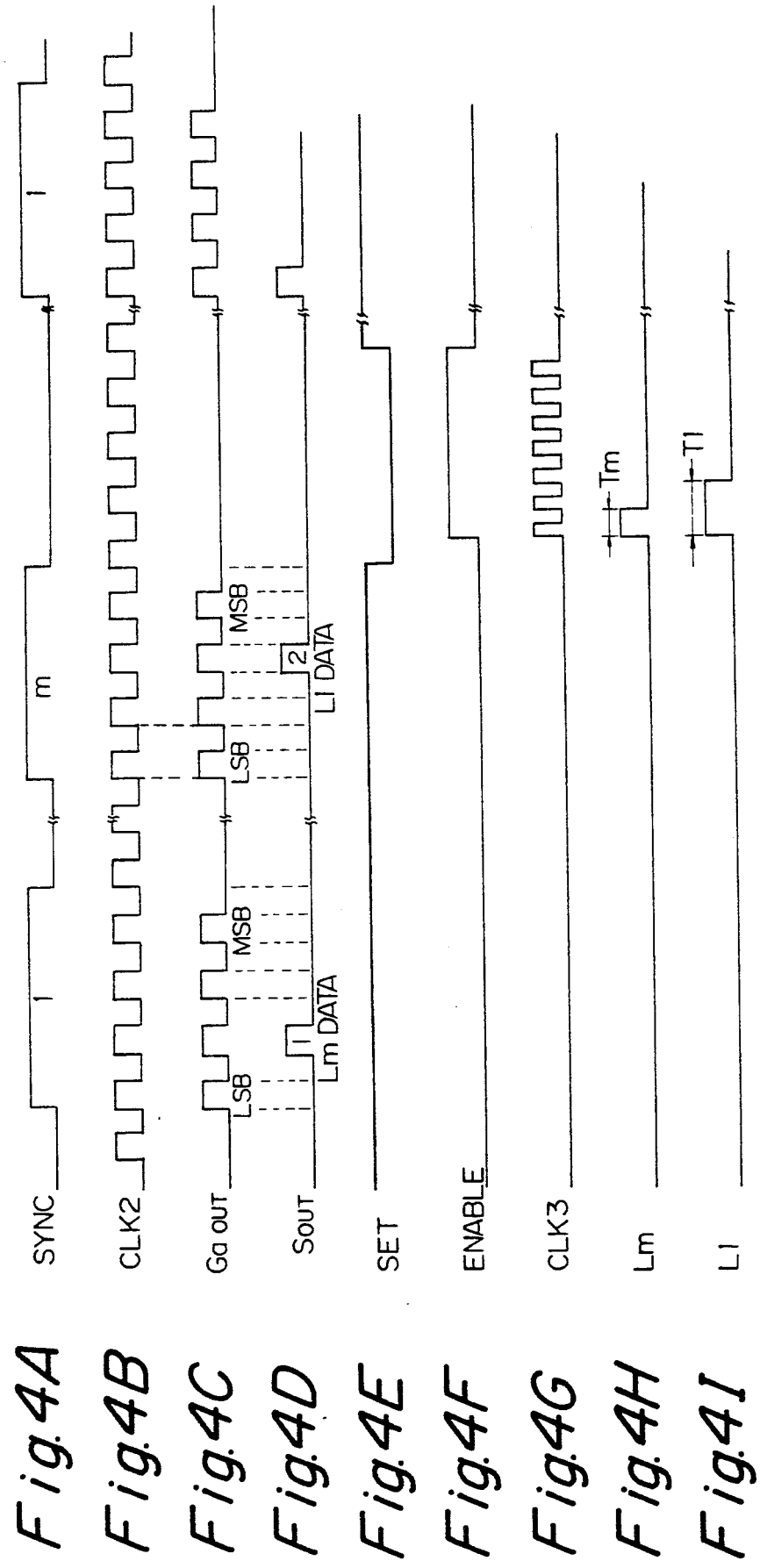
FIGS. 4A to 4I are timing charts useful for understanding the operation of the illustrative embodiment.

Specifically, the synchronizing signal SYNC, FIG. 4A, for the parallel-to-serial conversion of image data is four times the clock signal CLK2, FIG. 4B, adapted for data transfer with respect to the duration of the "H" level (one-fourth with respect to frequency). When the signal SYNC is "H", the clock CLK2 appears on the output of the AND gate Ga, FIG. 4C, with the result that 4-bit serial image data Sout is fed from the converter P/S to the first AND gate $G_{f1}$ of the print head HEAD, FIG. 4D. At the same time, the clock signal CLK2 is applied to the shift registers $S_1$ to $S_m$ via the AND gate Gb and OR gate Gc. Hence, while the signal SYNC is "H", one pixel of data is sequentially transferred to the shift registers $S_1$ to $S_m$ in response to the clock CLK2. Concerning the order of the image signal Sout, data $L_m$ is applied to the last shift register $S_m$ first, and data $L_1$ is applied to the first shift register $S_1$ last, whereby one line of scanning is completed. In this condition, i.e., when such are applied to all the LEDs $L_1$ to $L_m$, a set signal, FIG. 4E, appears to inhibit other data from being applied to the print heat HEAD in synchronism with the clock CLK.

The signal ENABLE appears at the timing for turning on one line of the head HEAD and disappears when the signal SET is reset, FIGS. 4E and 4F. When the signal ENABLE is "H", the clock signal CLK3 is applied to the individual shift registers $S_1$ to $S_m$ of the head HEAD in order to control the turn-on time of the LEDs on the basis of the recording states which have been set in the associated shift registers $S_1$ to $S_m$. Specifically, the output of the parallel-to-serial converter P/S has a pulse in any one of four bits, MSB to LSB, in association with image density. Therefore, the turn-on time of the LED controlled by the clock is dependent on the bit of the associated shift register in which the pulse exists. It follows that the turn-on time $T_m$ of the LED $L_m$, FIG. 4H, is shorter than the turn-on time $T_1$ of the LED $L_1$, FIG. 4I.

Figure 3:
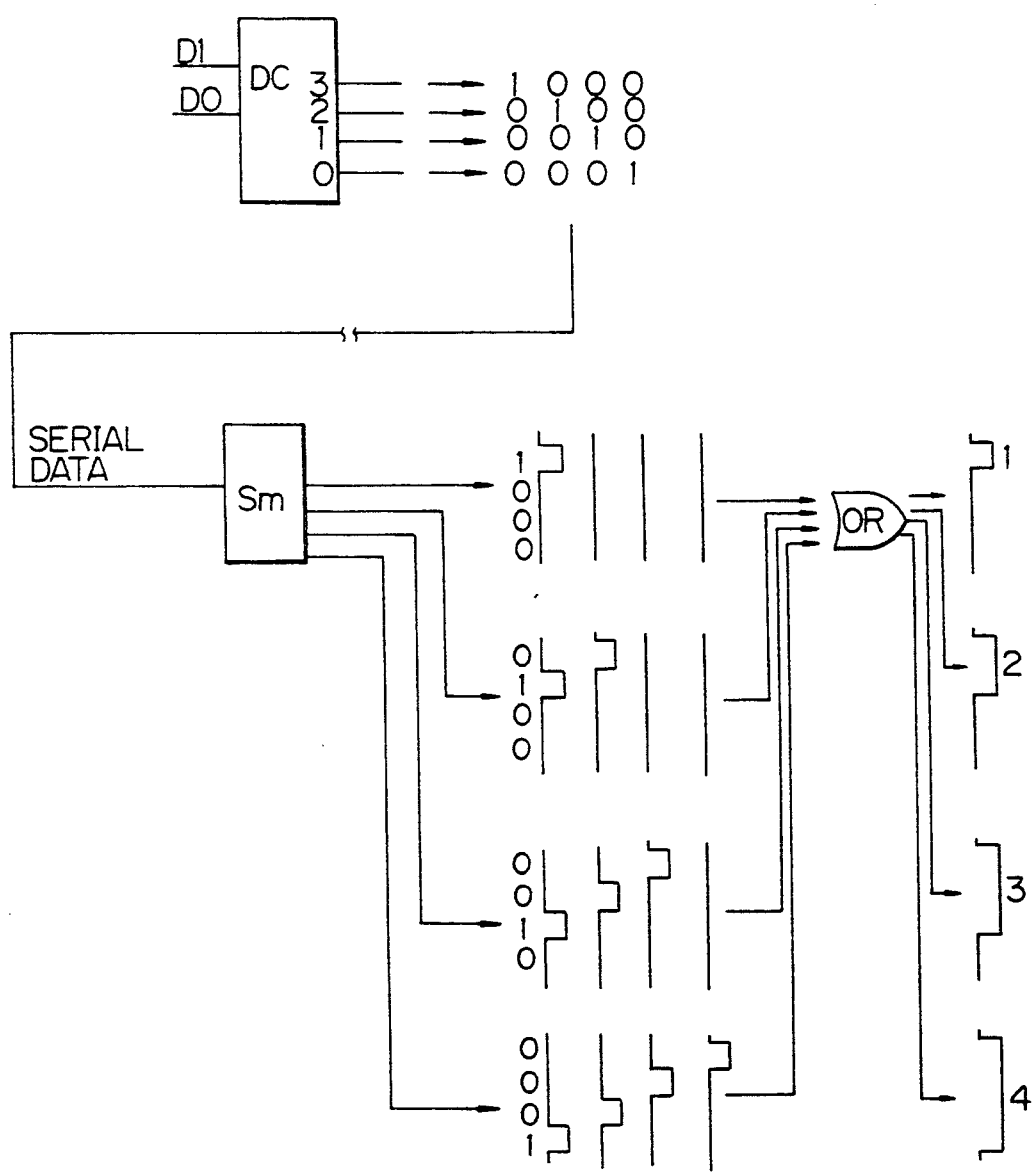
FIG. 3 shows an essential part of the control circuit of FIG. 2 specifically.

More specifically, as shown in FIG. 3, a 2-bit digital signal ($2^2$=four tone levels) $D_1$ and $D_0$ is applied to the 2/4 line decoder DC in response to the clock CLK1 and converted thereby into four lines ("1000", "0100", "0010" and "0001"). The output of the 2/4 line decoder DC is fed to the parallel-to-serial converter P/S, and the resulting serial data are delivered to the shift register $S_m$ and shifted three times each. The shifted data are applied to the associated OR gate, whereby a pulse width is determined. Based on the so determined pulse width, the turn-on time of the LD is controlled. Specifically, "1000", "0100", "0010" and "0001" are representative of the one pulse width, two pulse width, three pulse with, and four pulse width, respectively. The turn-on time of the LED increases with the increase in the pulse width.

As stated above, the illustrative embodiment increases or decreases the turn-on time of each light emitting element and, therefore, the exposing time of a photoconductive element, thereby rendering medium densities in an image.

Of course, the illustrative embodiment is practicable not only with four tones as shown and described but also with three tones or five or more tones. The conventional dither method may be used in combination with the illustrative embodiment in order to promote more precise representation of halftones.

An alternative embodiment of the present invention will now be described with reference to FIGS. 5 and 6A to 6I. The essential part of this alternative embodiment is substantially the same as the embodiment shown and described with reference to FIGS. 2, 3 and 4A to 4I, and the following description will concentrate on the differences. Specifically, the circuitry of FIG. 5 differs from the circuitry of FIG. 2 in that a clock generating circuit C is provided for switching the clock signal CLK3 between a plurality of frequencies. FIGS. 6A to 6I are exactly the same as FIGS. 4A to 4I, respectively.

Figure 5:
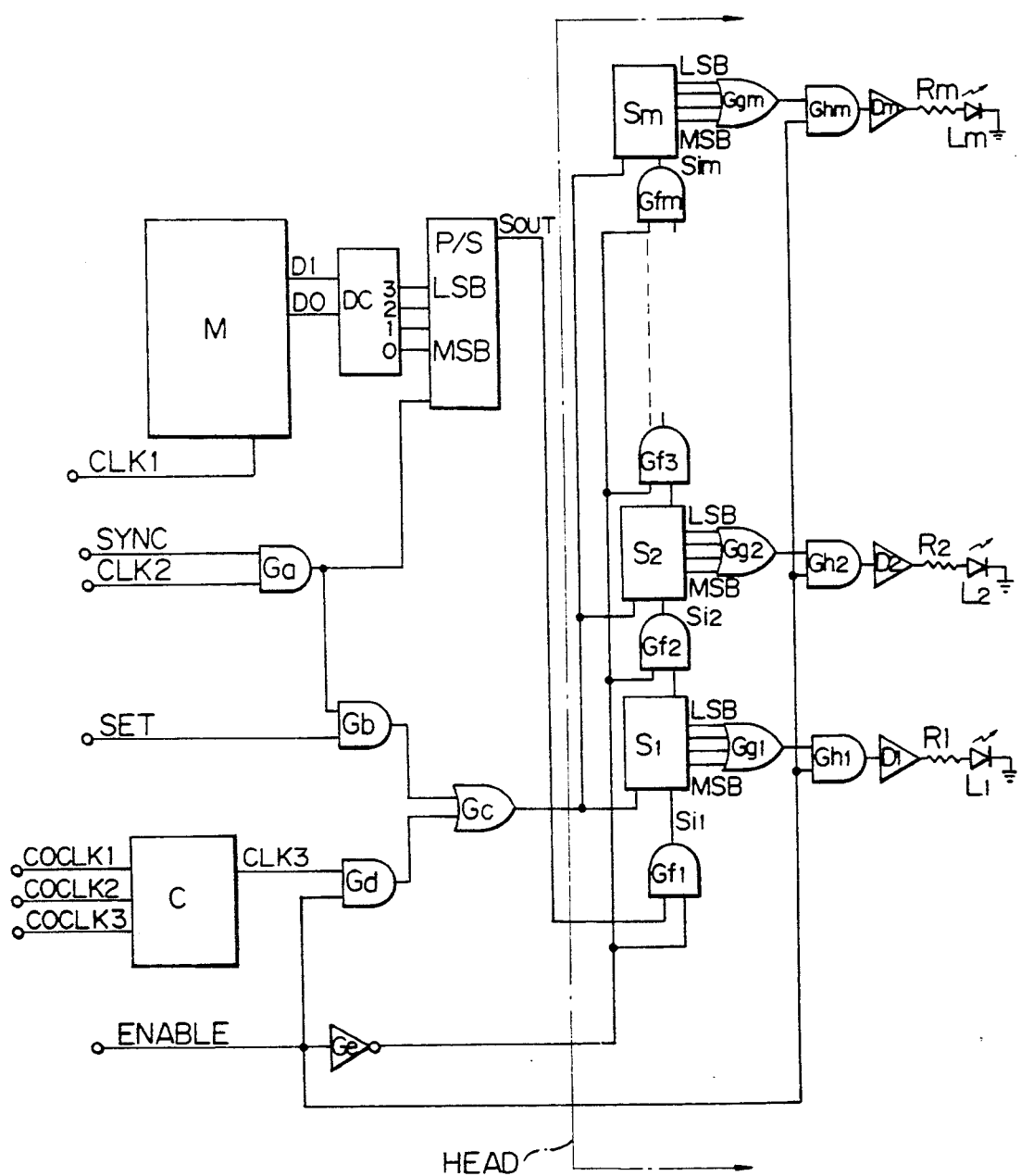
FIG. 5 is a block diagram schematically showing an alternative embodiment of the present invention.

As shown in FIG. 5, the clock generating circuit C receives a 3-bit clock control signal COCLK1 to COCLK3 from a main controller, not shown. In response, the circuit C changes the frequency of the clock CLK3 which controls the individual shift registers when their LEDs are to be turned on. The circuit C can be readily implemented by conventional technologies, and details thereof will not be described herein. For example, the frequency division ratio of a variable frequency divider may be changed by the 3-bit clock control signal.

FIGS. 6J to 6L indicate a specific condition wherein the frequency of the above-mentioned clock CLK3 is changed. Assuming that the frequency of the clock CLK3 is halved, then the shifting time at the time of turn-on of the LED and, therefore, the turn-on time itself is doubled. If a more minute change is desired, a higher clock frequency may be used in which case the frequency division ratio will be set more minutely. With this alternative embodiment, it is possible to adjust the turn-on time of light emitting elements as desired. Hence, when the intensity of light issuing from LEDs or similar light emitting elements is lowered due to aging, the turn-on time may be increased to compensate for the fall of the intensity. This is successful in compensating for not only the deterioration of light emitting elements themselves but also for the changes in the characteristics of a photoconductive element and its associated units.

In summary, it will be seen that the present invention provides a drive control circuit for an optical print head which adapts itself even to a high-speed printer despite an extremely simple and inexpensive construction thereof.

Various modifications will become possible for those skilled in the art after receiving the teachings of the present disclosure without departing from the scope thereof.

What is claimed is:

1. An optical printer using a print head having a plurality of light emitting elements for reproducing $2^n$ tones for n-bit digital image data representative of one pixel, said printer comprising:
   decoder means for converting the n-bit image data into $2^n$-bit image data;
   a plurality of $2^n$-bit serial shift register means, each being associated with respective ones of the light emitting elements and receiving $2^n$-bit image data outputted by said decoder means; and
   control means for controlling input of the $2^n$-bit image data to said plurality of serial shift register means such that when image data are inputted to said individual serial shift register means, input of next image data is inhibited and, by a clock signal having a predetermined frequency, the light emitting elements are each turned on for a period of time associated with a logical value of the $2^n$-bit image data stored in associated ones of said serial shift register means.

2. A printer as claimed in claim 1, wherein the predetermined frequency of the clock signal generated for turning on the light emitting elements according to the logical values of the internal states of said serial shift register means is variable.

3. An optical printer using a print head having a plurality of light emitting elements for reproducing $2^n$ tones for n-bit digital image data representative of one pixel, said printer comprising:

decoder means for converting the n-bit image data into $2^n$-bit parallel image data;

a parallel to serial converter for converting the $2^n$-bit parallel image data into $2^n$-bit serial image data;

a plurality of $2^n$-bit serial shift register means, each being associated with respective ones of the light emitting elements and receiving $2^n$-bit serial image data outputted by said parallel to serial converter; and control means for controlling input and storage of the $2^n$-bit serial image data to said plurality of serial shift register means such that when image data are inputted to each of said shift register means, input of next image data is inhibited and, by a clock signal having a predetermined frequency, the light emitting elements are each turned on for a period of time determined by a logical value of the $2^n$-bit serial image data stored in associated ones of said serial shift register means.

4. A printer as claimed in claim 3, wherein the $2^n$-bit serial image data stored in associated ones of said serial shift register means which determine the turned-on time period of the light emitting elements is output from said shift register means in parallel and input into respective OR gates.

5. A printer as claimed in claim 3, wherein the predetermined frequency of the clock signal generated for turning on the light emitting elements according to the logical values of the $2^n$-bit serial image data stored in the serial shift register means is variable.

6. An optical printer using a print head having a plurality of light emitting elements for reproducing $2^n$ tones for n-bit digital image data representative of one pixel, said printer comprising:

decoder means for converting the n-bit image data into $2^n$-bit parallel image data, wherein said $2^n$-bit parallel image data is output on a plurality of output lines and each $2^n$-bit parallel image data has only one bit which is at a logical high value;

a parallel to serial converter for converting the $2^n$-bit parallel image data into $2^n$-bit serial image data;

a plurality of $2^n$-bit serial shift register means, each being associated with respective ones of the light emitting elements and receiving $2^n$-bit serial image data outputted by said parallel to serial converter; and control means for controlling input and storage of the $2^n$-bit serial image to said serial shift register means such that when image data are inputted to said plurality of serial shift register means, input of next image data is inhibited and, by a clock signal having a predetermined frequency, the light emitting elements are each turned on for a period of time determined by a logical value of the $2^n$-bit serial image data stored in associated ones of said serial shift register means.

7. A printer as claimed in claim 6, wherein the $2^n$-bit serial image data stored in associated ones of said serial shift register means which determine the turned-on time period of the light emitting elements is output from said shift register means in parallel and input into respective OR gates.

8. A printer as claimed in claim 6, wherein the predetermined frequency of the clock signal generated for turning on the light emitting elements according to the logical values of the $2^n$-bit serial image data stored in the shift register means is variable.

* * * * *